United States Patent [19]

Wilson

[11] Patent Number: 5,018,170

[45] Date of Patent: May 21, 1991

[54] VARIABLE DATA RATE CLOCK SYNTHESIZER

[75] Inventor: Michael L. Wilson, Salt Lake City, Utah

[73] Assignee: Unisys Corporation, Blue Bell, Pa.

[21] Appl. No.: 440,006

[22] Filed: Nov. 21, 1989

[51] Int. Cl.$^5$ .............................................. H03D 3/24
[52] U.S. Cl. ...................................... 375/120; 331/14; 331/25
[58] Field of Search .......................... 375/82, 120, 119; 331/1 A, 1 R, 10, 25, 14; 328/155, 14

[56] References Cited

U.S. PATENT DOCUMENTS

| | | | |
|---|---|---|---|
| 4,151,485 | 4/1979 | LaFratta | 331/1 A |
| 4,563,657 | 1/1986 | Qureshi et al. | 331/25 |
| 4,568,888 | 2/1986 | Kimura et al. | 331/10 |
| 4,574,243 | 3/1986 | Levine | 328/155 |
| 4,791,488 | 12/1988 | Fukazawa | 375/120 |

Primary Examiner—Douglas W. Olms
Assistant Examiner—Stephen Chin
Attorney, Agent, or Firm—John B. Sowell; Mark T. Starr; Thomas J. Scott

[57] ABSTRACT

A novel digital variable rate clock synthesizer is provided with a novel fractional-N digital phase locked loop. The all digital phase locked loop employs a digital input signal to a phase comparator which has a second input coupled to a digital control oscillator through a divide by N or a divide N+1 circuit. The digital output of the phase comparator is coupled to an error accumulating circuit which has a phase correction input signal from a fractional register and an associated accumulator. The output from the error accumulator is coupled to a pair of detectors for generating phase and frequency error detection signals which are digitally coupled to the control input of the digital control oscillator to provide a variable frequency output selected by the value of N and N+1.

9 Claims, 3 Drawing Sheets

VARIABLE DATA RATE CLOCK SYNTHESIZER

BACKGROUND OF THE INVENTION

1. Field of the Invention

The present invention is related to fractional-N phase locked loops. More particularly, the present invention relates to a novel digital fractional-N phase locked loop embodied in a novel variable data rate all digital clock synthesizer.

2. Description of the Prior Art

There are not now commercially available any all digital phase locked loop integrated circuit devices. Further, there are no known all digital variable data rate clock synthesizers which employ all digital fractional-N phase locked loops.

There are analog fractional-N phase locked loop circuits which are shown and described in text books such as the third edition of "Frequency Synthesizers-Theory and Design" by Vadim Mannassewitsch; copyright 1987 by John Wiley & Sons, Inc. see section 1-5 "Fractional-N Phase locked Loop". Such circuits have been used in commercially available synthesized signal generators such as the Hewlett Packard Model HP-8662A.

It would be desirable to provide an all digital fractional-N phase locked loop of the type easily reduced to a single discreet integrated circuit chip device.

SUMMARY OF THE INVENTION

It is the principal object of the present invention to provide an all digital variable rate clock synthesizer.

It is the principal object of the present invention to provide an all digital high frequency variable rate clock synthesizer.

It is another principal object of the present invention to provide a high frequency variable rate clock synthesizer having a novel all digital fractional-N phase locked loop which permits change of the variable frequency during operation without losing synchronization.

It is another principal object of the present invention to provide a high frequency variable rate clock synthesizer having a clock frequency accuracy several orders of magnitude higher than prior art hybrid analog/digital devices.

It is another principal object of the present invention to provide a high frequency variable rate clock synthesizer which is simpler and cheaper than prior art analog devices.

It is another principal object of the present invention to provide a high frequency variable rate clock synthesizer having a wideband phase locked loop or tracking loop which permits faster acquisition and tracking response than prior art phase locked loops.

It is another principal object of the present invention to provide a high frequency variable rate clock synthesizer having a phase locked loop with very high frequency resolution over a wide range of frequencies which permits rapid recovery of data at high frequency rates.

It is another principal object of the present invention to provide a high frequency variable rate clock synthesizer circuit having a reference oscillator whose frequency is lower than the output clock frequency which enables implementation of the complete synthesizer circuit on a single integrated circuit chip.

It is another principal object of the present invention to provide a high frequency variable rate clock synthesizer operable at frequencies from as low as 150 hertz to frequencies in excess of 20 megahertz employing conventional TTL and ECL circuitry.

It is another principal object of the present invention to provide a high frequency variable rate clock synthesizer having a frequency resolution defined by the digital bits employed in the command word thus providing resolution accuracy up to the resolution of the reference frequency oscillator.

It is a general object of the present invention to provide a novel fractional-N phase locked loop circuit which permits the use of cheaper oscillators to achieve the same or better stability than prior art phase locked loops.

According to these and other objects of the present invention, there is provided a novel high frequency all digital variable rate clock synthesizer having an external stable analog reference frequency oscillator. The reference frequency oscillator is coupled to a digital phase comparator whose output is coupled to an error accumulator. The accumulated errors are coupled to a pair or detectors for detecting both phase and frequency errors. The digital outputs are coupled to an oscillator control logic circuit error for controlling a digitally controlled oscillator. The output of the digitally controlled oscillator is coupled through a divide by N circuit to the digital phase comparator and is also coupled to the data clock output through a divider circuit to provide a highly stable substantially square wave output for digital operations.

DESCRIPTION OF THE PREFERRED EMBODIMENT

Figure 1:
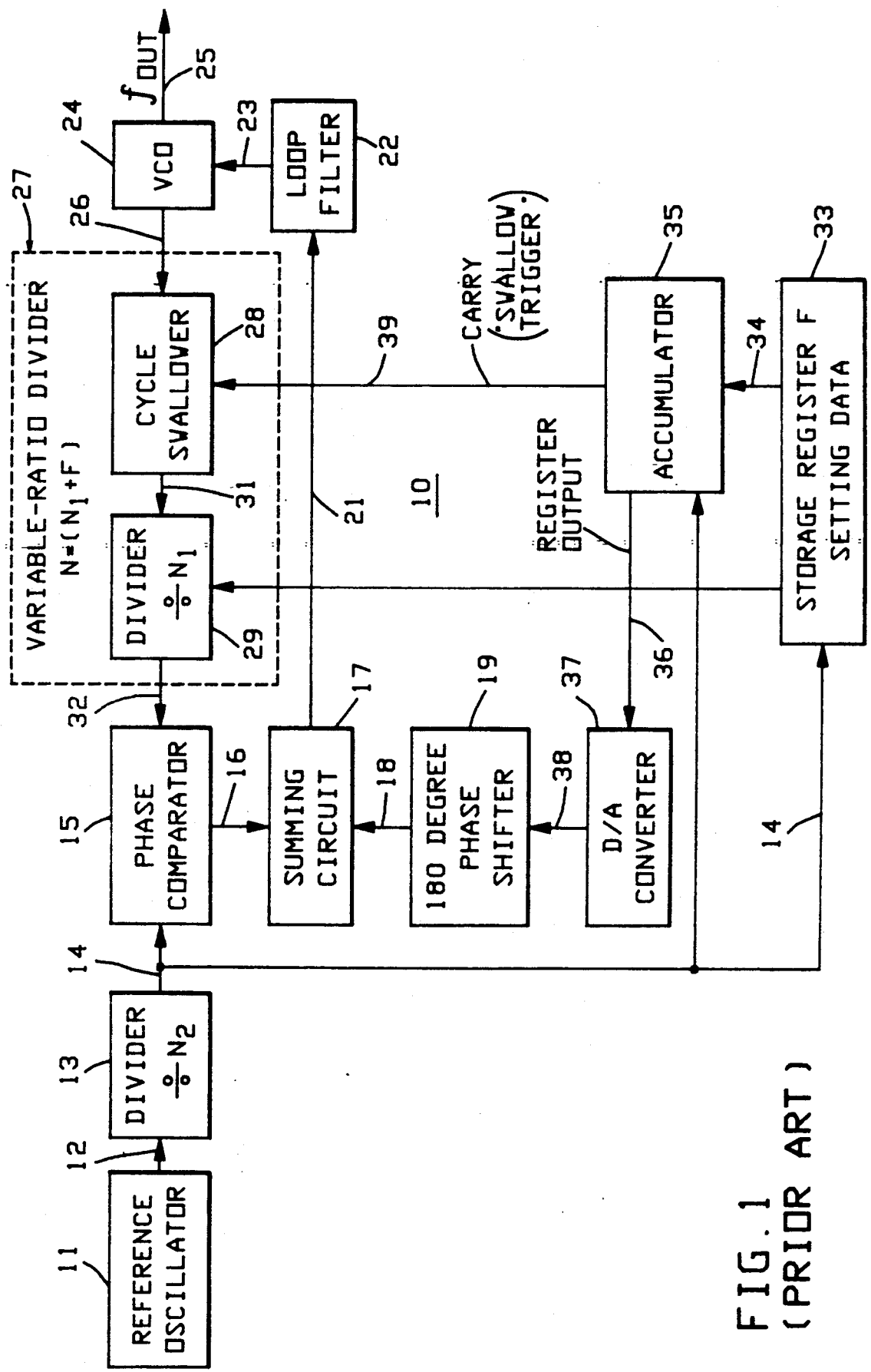
FIG. 1 is a schematic block diagram of a prior art signal synthesizer fractional-N phase locked loop.

Refer now to FIG. 1 showing a prior art signal synthesizer fractional-N phaselocked loop (PLL) 10. The theory and operation of the prior art phaselocked loop 10 is also found in the aforementioned textbook entitled "Frequency Synthesizers-Theory and Design". The fractional-N PLL 10 is shown having a reference oscillator 11 coupled via line 12 to a divide by N circuit 13. The reduced frequency or step down frequency on line 14 is applied to an analog phase comparator 15 The output of the phase comparator on line 16 is applied to a summing circuit 17 which has a second quadrature input on line 18 from a 180° phase shifter 19. The output of the summing circuit on line 21 is applied to a loop filter 22 to produce an error voltage signal on output line 23 which is applied to a conventional analog VCO 24. The output of the VCO 24 on line 25 is sinusoidal but may be employed in conventional circuits to provide a clock signal. The clock signal on line 26 at the output of VCO 24 is applied to a variable-ratio divider 27 shown in phantom lines comprising a cycle swallower 28 and a second divide by N circuit 29 coupled thereto via line 31. The output of the second divide by N circuit 29 on line 32 is applied to the analog phase comparator 15 as the internal clock signal.

Setting data in digital format may be inserted into storage register 33 to provide output signals on line 34 indicative of the frequency F desired by register 33. The input clock signal on line 14 enables the register 33 to provide continuous correction information on line 34 which is accumulated in accumulator 35 to provide the final correction information on register output line 36 that is coupled to digital analog (D/A) converter 37 to provide a voltage error signal on line 38. The analog voltage error signal on line 38 is phase shifted 180° in phase shifter 19 to provide an error correction signal on line 18 which is applied to the sum and difference circuit 17. The output of the sum and difference circuit 17 on line 21 is an unfiltered error signal for controlling the voltage control oscillator 24.

It will be noted that the information in storage register 33 and in accumulator 35 is in a digital format which is converted at the D/A converter 37, thus, all of the circuitry from the D/A converter 37 through the phase locked loop are analog devices except the variable ratio divider 27. When the accumulator 35 accumulates a predetermined number, such as 1, it produces a carry signal or swallow trigger signal on line 39 to the cycle swallow circuit 28 which swallows or eliminates one cycle of the signal on line 26 before producing an output signal on line 31. Circuit 28 will effectively reduce the frequency of the signal on line 32 to the phase comparator 15 By swallowing or eliminating one cycle produces a signal result known as fractional-N dividing.

Figure 2:
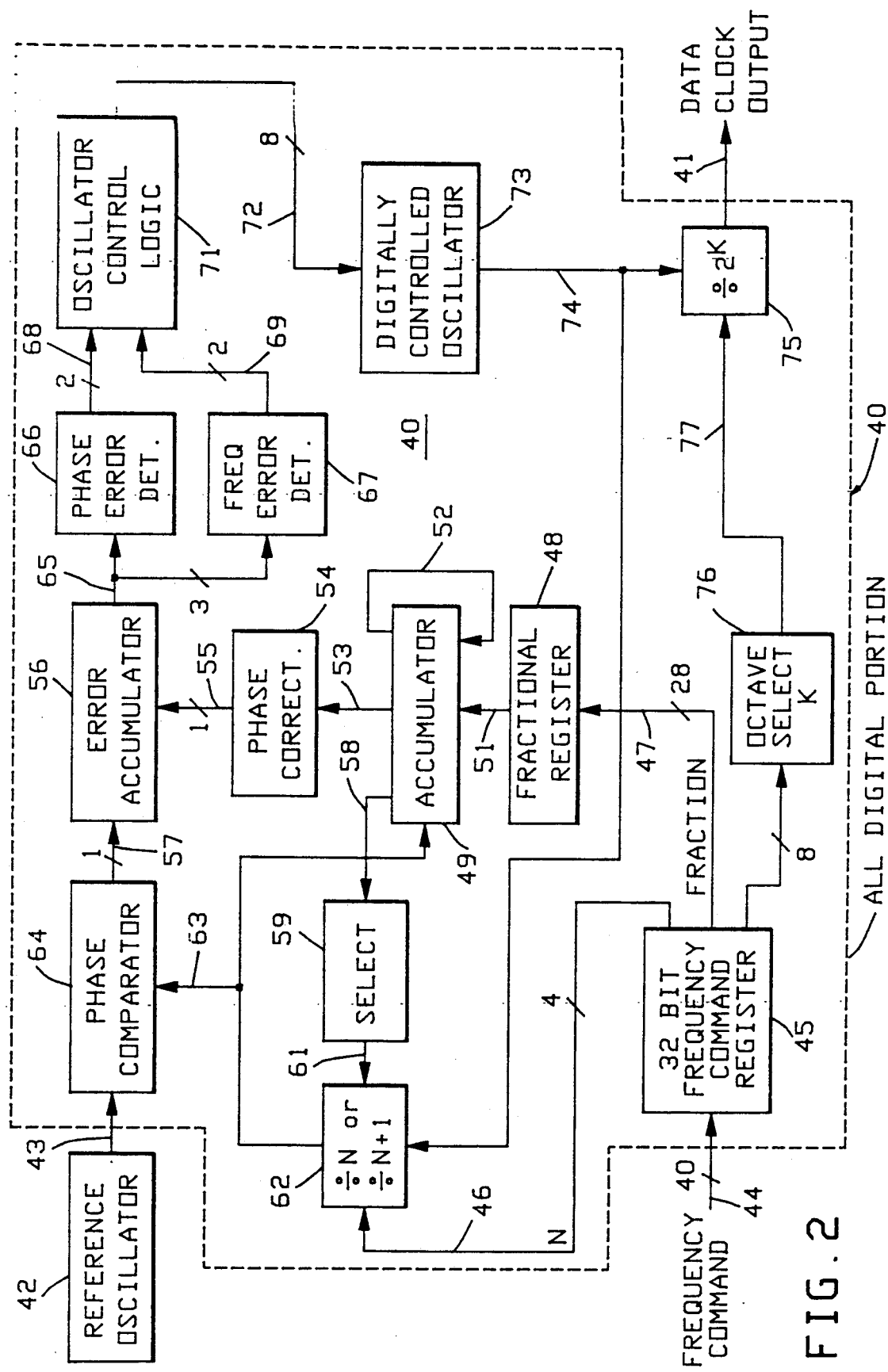
FIG. 2 is a schematic block diagram of the present invention all digital variable rate clock synthesizer having a novel fractional-N phase locked loop.

Refer now to FIG. 2 showing a block diagram of the preferred embodiment of the present invention, All Digital Variable Rate Clock Synthesizer. The all digital synthesizer is shown inside of phantom lines 40 having a data clock output at line 41 and a reference oscillator 42 which provides a reference oscillator input signal on line 43. Further, there is provided means for inserting a frequency command for variable frequency rates on line 44 to the all digital clock synthesizer 40. A 40-bit command data on line 44 is applied to the command register 45. Four of the 32 bits which describe the desired frequency are applied to the N control line 46 and 28 of the 32 bits are applied to the fraction control line 47 that is an input to the fractional register 48. The fraction register 48 is coupled to an accumulator 49 via an input line 51. The signal on line 51 is in digital form and continues to accumulate via recirculation loop 52 and provides a phase correction signal on line 53 to the phase correction circuit 54. The output of the phase correction circuit on line 55 is applied to an error accumulator 56 which has a second error input signal on line 57. The error signals on lines 55 and 57 are in digital form and in the preferred embodiment are single bits. If the fractional signal stored in register 48 creates a predetermined accumulated value on output line 58, then the select circuit 59 will generate a select signal on line 61 which causes the divide by N circuit 62 to now divide by the factor N+1 instead of N. When the signal is present on select line 61, the divide by N circuit 62 was operating as a divide by N circuit. When the predetermined signal on line 58 in the preferred embodiment reaches a digital 0.5 number, the select circuit can change the divide by N circuit 62 so as to generate a step down signal on line 63 that is applied to the phase comparator 64 which is further provided with the aforementioned input signal from the reference oscillator 42 on line 43. The digital error signal output on line 57 is indicative of an early or late phase condition between the signal on line 63 and the reference signal on line 43. The reference oscillator 42 is an analog device having an internal hard limiter which produces a digital square wave on line 43 to the digital phase comparator 64 for comparison with the digital square wave on line 63.

Error accumulator 56 is provided with two digital inputs on lines 55 and 57 and outputs a result of the comparison of the two inputs as three bits on output line 65 which is coupled to a phase error detector 66 and a frequency error detector 67. Each of the error detectors 66 and 67 produce a two bit output on their respective output lines 68 and 69 which are applied to the digital oscillator control logic 71 to produce the desired eight bit oscillator control signal on line 72 that is applied to the digital control oscillator 73. Digital control oscillators are known in the art. In the preferred embodiment of the present invention loop signals are amplified and recirculated control loop which select frequency dividers which generates the synthesize loop frequency on line 74 The PLL signal on line 74 is a square wave signal which is applied to the aforementioned divide by circuit 62 and also applied as an input to the divide by $2^K$ circuit 75. When the selected octave value K=0 the divide by K circuit 75 is effectively one or taken out of the circuit However, when the frequency command word on line 44 requires that a different K be selected for a higher or lower octave, the information is stored in octave select buffer register 76 and applied to the divide by K circuit 75 via line 77.

Having explained the operation of the novel phase locked loop circuit, it will be appreciated that an all digital fractional-N phase locked loop is incorporated into a variable data rate digital clock synthesizer and may be employed in high frequency tracking loop, data recovery loops, bit synchronizers and other forms of digital circuitry which require precision and fast acquisition high frequency phase locked loops. The present invention synthesizer phase locked loop was built and tested with a reference oscillator having 4.85 megahertz stable frequency. The command frequencies on line 44 provided 64 discreet steps over the octave range of 10 to 20 megahertz. The octave select factor K was zero thus eliminating the divide by 2K circuit 75. The 64 steps changed the value of N from 2 to 4 and the value of N+1 would thus become a range of 3 to 5. The same circuit used for 10 to 20 megahertz may be used for data rate clocks from 150 hz to 20 megahertz in steps of 20 megahertz divided by 2 to the 32nd employing 32 bit frequency commands. Thus, it will be understood that the digital selectable frequency far exceeds the stability of the reference oscillator 42.

Figure 3:
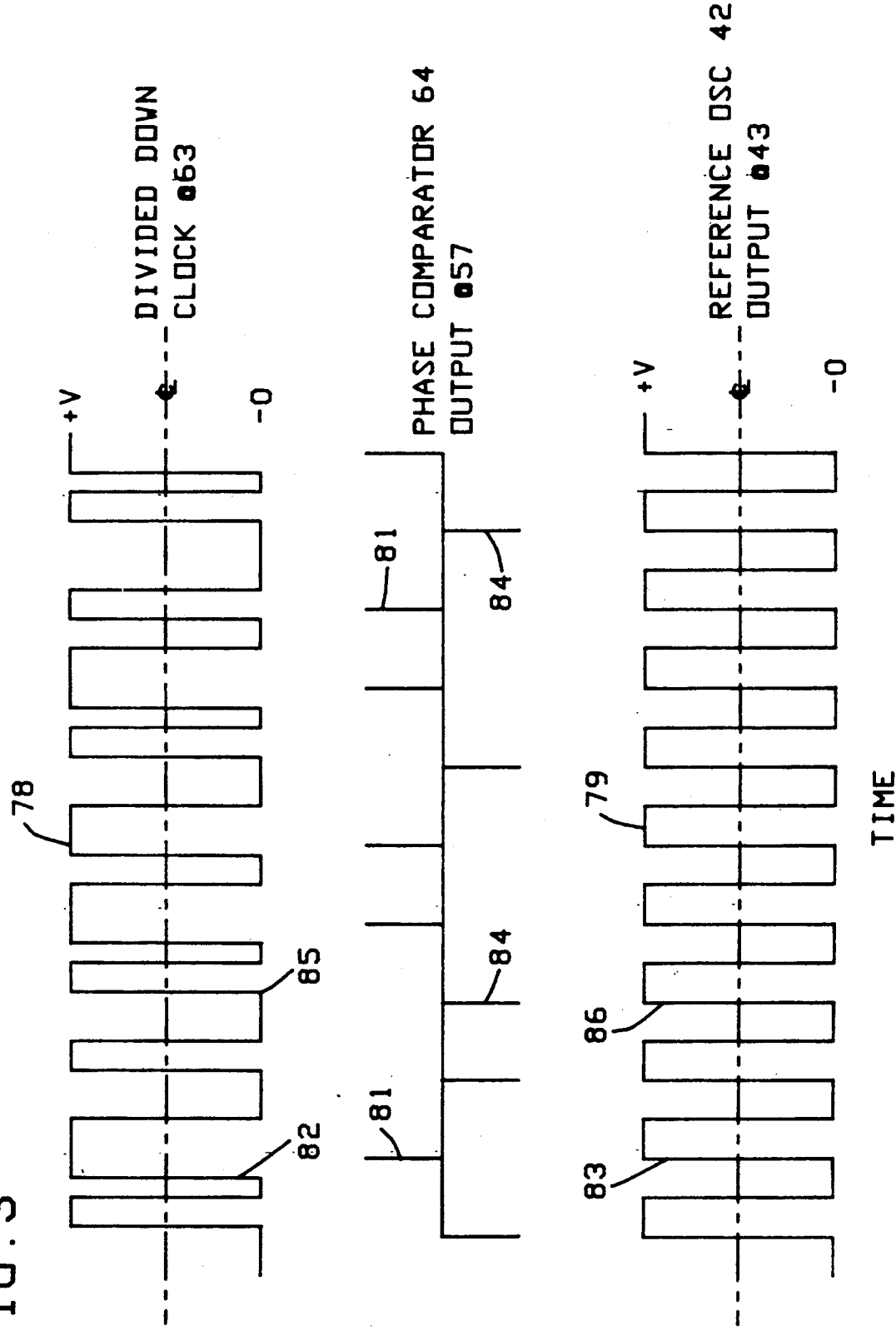
FIG. 3 is a signal waveform diagram showing the phaselocked loop clock waveform, the reference oscillator input clock waveform and the output of the digital phase comparator.

Refer now to FIG. 3 showing a signal waveform diagram. The divided down clock at line 63 is shown as waveform 78 having a center line which divides the zero reference from the +V digital value. In similar manner, the reference oscillator 42 is provided with an output at line 43, shown as waveform 79, which is slightly out of phase with waveform 78 in order to show that the phase comparator 64 generates a digital output signal on line 57 indicative of the early or late phase detected by the phase comparator 64 Digital signal 81 illustrates that the clock signal at point 82 is earlier than the clock signal at point 83 The digital signal 84 illustrates that the point 85 is later than the point 86 on the reference oscillator output. The output of the phase comparator 64 on line 57 illustrates that high digital signals 81 represent a late reference oscillator and that low digital signals 84 represent early reference oscillator signals. The polarity of the reference signals may be changed without changing the logic or mode of operation of the preferred embodiment variable data rate digital clock synthesizer.

Having explained a preferred embodiment of the present invention, it will be understood that a phase comparator 64 receives a digital signal in the preferred embodiment. It is possible to design a hard limiter at the input of the phase comparator 64 which would be an on-chip circuit. All of the circuitry shown inside of the phantom lines 40 may easily be implemented on a single integrated circuit chip. Using conventional TTL circuitry, the chip would easily be capable of 60 megahertz and employing ECL circuitry, the circuit would be capable of around 200 megahertz and employing gallium arsenide circuitry, the circuit would be capable of 5 to 10 gigahertz. Even though the novel circuitry is designed for use at higher frequencies, it may be employed in a low frequency environment when made cheaply in a discreet integrated circuit form.

While there may be disclosures of all digital phase locked loops, it will be noted that such prior art circuits either require much higher frequency reference sources which are stepped down by in the divide by N circuits or have analog component which perform some of the functions of the present invention circuit. The present invention circuit is a variable rate clock synthesizer and is not to be confused with digital phaselocked loops which have a fixed or limited set of frequencies.

What is claimed is:

1. A digital variable rate clock synthesizer, comprising:
    an all digital phase locked loop (PLL) having a phase comparator with one input coupled to a source of digital reference signals, and
    a second phase comparator input coupled through a variable ratio divider circuit to a digital controlled oscillator,
    said PLL having an error accumulator coupled to the output of said phase comparator to provide a digital output error signal,
    said digital output error signal being coupled to the input of a frequency error detector and to a phase error detector,
    digital oscillator control means coupled to the output of said error detectors for providing output digital control signals for controlling said digital controlled oscillator, and
    a second variable ratio divider circuit coupled to the output of said digital controlled oscillator to provide a selectable frequency digital clock output signal.

2. A digital synthesizer as set forth in claim 1 which further includes a command control register coupled to said second variable ratio divider circuit by means of a circuit for selecting said selectable digital clock output frequency.

3. A digital synthesizer as set forth in claim 2 which further includes a fractional register coupled to said command control register for producing fractional error signals which are coupled to said variable ratio divider circuit.

4. A digital synthesizer as set forth in claim 3 which further includes means for accumulating said fractional error signals coupled to said fractional register, and
    selector means coupled to the accumulating means for changing said variable ratio divider circuit from a divide by N mode to a divide by N+1 mode.

5. A digital synthesizer as set forth in claim 4 which further includes a phase correction means coupled to the output of said accumulating means for generating a phase correction error signal resulting from a fractional division that is applied as a second input to said error accumulator.

6. A digital synthesizer as set forth in claim 2 wherein said circuit for selecting includes an octave selection register coupled to said second variable ratio divider circuit and to said command control register for selecting said selectable frequency of said digital clock output.

7. A digital synthesizer as set forth in claim 6 wherein said second variable ratio divider circuit comprises a divide by $2^K$ circuit and integer K is selectable.

8. A digital synthesizer as set forth in claim 7 where the value k is a whole number in the range from 0 to infinity only limited by the number of digital bits employed to define the upper limit of division.

9. A digital synthesizer as set forth in claim 7 where the value k is zero which effectively eliminates said second variable ratio divider circuit from the digital clock output signal.

* * * * *